(12) United States Patent
Martin et al.

(10) Patent No.: US 6,333,550 B1
(45) Date of Patent: Dec. 25, 2001

(54) SURFACE MOUNT SEMICONDUCTOR DIODE DEVICE

(75) Inventors: Jean-Baptiste Martin; William D. Wasmer, both of Toulouse (FR)

(73) Assignee: Semiconductor Components Industries LLC, Phoenix, AZ (US)

( * ) Notice: Subject to any disclaimer, the term of this patent is extended or adjusted under 35 U.S.C. 154(b) by 507 days.

(21) Appl. No.: 08/820,428

(22) Filed: Mar. 12, 1997

(30) Foreign Application Priority Data

May 15, 1996 (FR) .................................................. 96 06064

(51) Int. Cl.[7] .................................................. H01L 23/48
(52) U.S. Cl. .............................................. 257/693; 257/731
(58) Field of Search .................................... 257/690, 692, 257/693, 696, 720, 731, 732, 733, 792; 361/760, 783, 805, 806

(56) References Cited

U.S. PATENT DOCUMENTS 3,209,209 * 9/1965 Mueller ................................. 317/101
4,758,875 * 7/1988 Fujisaki et al. ........................ 357/72

* cited by examiner

Primary Examiner—Olik Chaudhuri
Assistant Examiner—Douglas A. Wille

(57) ABSTRACT

A surface mount semiconductor diode device (50) having first (51) and second (53) coplanar contacts comprises a semiconductor element (52) having a first surface electrically mounted on a first member (54) formed of conductive material, which first member (54) has an arm (58) extending in a direction away from the semiconductor element (52) to an end (60) which forms the first contact (51). A cup member (62) formed of conductive material comprises a wall (64) extending from a bottom portion (66) so as to form an opening (68) surrounded by the wall (64). The semiconductor element (52) and first member (54) are mounted within the opening (68) such that a second surface of the semiconductor element (52) is electrically coupled to the bottom portion (66) of the cup member (62) and the end of the arm (58) extends above a top surface (72) of the wall (64). The cup member (62) further comprises a leg portion (74) integral with and extending from the top surface of the wall (64) such that an end (76) of the leg portion (74) is coplanar with the end of the arm, and forms the second contact (53).

9 Claims, 3 Drawing Sheets

SURFACE MOUNT SEMICONDUCTOR DIODE DEVICE

FIELD OF THE INVENTION

This invention relates to a surface mount semiconductor diode device.

BACKGROUND OF THE INVENTION

Surface mount semiconductor diode devices typically comprise a semiconductor element electrically mounted on a first surface of a heat sink. A second opposing surface of the heat sink provides a first contact for the device. A conductive tab or leg is coupled to an opposing surface of the semiconductor element and is bent so that an end of the tab is substantially coplanar with the first contact, the end forming the second contact of the device.

In the surface mount diode U5ZA27 manufactured by Toshiba, the tab is connected directly to the surface of the semiconductor element. However, it is also known, for example with the surface mount diode MR2535S supplied by Motorola, Inc., to have an additional heat sink coupled to the opposing surface of the semiconductor element with the tab connected to the heat sink.

With both such types of devices, the surface areas of the first and second contacts are significantly large. Having large contact surface areas can lead to soldering difficulties when mounting such devices on, say, a circuit board. Ea addition, the heat sinks of such devices are large and the devices are arranged so that once mounted on a circuit board, the heat sinks are located on the board. With such arrangements, however, heat is transferred to the circuit board solder junction which can result in circuit board solder failures.

The semiconductor elements of both types of devices are encapsulated in a molding compound, typically molded epoxy, by injecting epoxy at high pressure. The stress caused by such a high pressure process step reduces the reliability of a device since molding stress can result in cracked die, mold voids and mold flashes.

The latter type of devices, in which the tab is connected to the heat sink, suffer from additional problems. Since the tab must be soldered to the heat sink, these type of devices require an additional step in their manufacture which increases their manufacturing cost. Furthermore, the step of attaching the tab to the heat sink typically requires a high temperature which may damage the semiconductor element leading to device failure. A further disadvantage with using tabs is that with the second process step of soldering the tab to the heat sink, it can be difficult ensuring that the tab is the correct height and hence that the first and second contacts are coplanar.

It would therefore be desirable to provide an improved surface mount semiconductor diode device in which the above problems and disadvantages are mitigated.

SUMMARY OF THE INVENTION

In accordance with the present invention there is provided a surface mount semiconductor diode device having first and second coplanar contacts, the device comprising:

a semiconductor element having a first surface electrically mounted on a surface of a first member formed of conductive material, the first member having an arm which extends in a direction away from the surface of the first member, an end of the arm forming the first contact; and a cup member formed of a conductive material and comprising a wall extending from a bottom portion so as to form an opening surrounded by the wall and having the bottom portion as a base, wherein the semiconductor element and first member are mounted within the opening such that a second surface of the semiconductor element is electrically coupled to the bottom portion of the cup member and the end of the arm extends above a top surface of the wall, wherein the cup member further comprises a leg portion integral with and extending from the top surface of the wall such that an end of the leg portion is coplanar with the end of the arm, the end of the leg portion forming the second contact.

Thus, the present invention provides a surface mount semiconductor diode device having two coplanar contacts which is simple to manufacture and which does not require additional steps to attach tabs for one of the contacts.

BRIEF DESCRIPTION OF THE DRAWINGS

A surface mount semiconductor diode device in accordance with the present invention and a method for forming a surface mount semiconductor diode device in accordance with the present invention will now be described, by way of example only, with reference to the accompanying drawings in which.

DETAILED DESCRIPTION OF THE DRAWINGS

Figure 1:
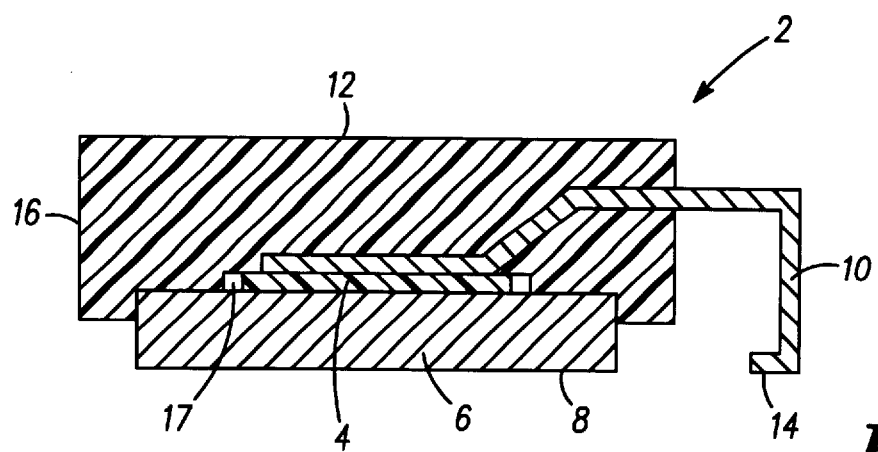
FIG. 1 is a cross-sectional schematic diagram of a known surface mount semiconductor diode device.

FIG. 1 shows an example of a known surface mount semiconductor diode device 2, such as the U5ZA27 device supplied by Toshiba. The device 2 comprises a die 4 electrically mounted on a first surface of a heat sink 6. An opposing surface 8 of the heat sink forms a first contact 8 of the device 2. A tab or leg 10 has one end 12 electrically coupled to the die 4. The tab 10 is bent so that its other end 14 is substantially coplanar with the opposing surface 8 of the heat sink 6. The other end 14 of the tab 10 forms the second contact 14 of the device 2. The die 4, part of the tab 10, and part of the heat sink 6 are then encapsulated with molded epoxy 16 under high pressure.

The device 2 shown in FIG. 1 is an open junction type of device which means that the junction is on the wall of the die 4. In order to avoid shorts, a dielectric layer 17 surrounds the wall of the die 4. Typically the dielectric layer 17 comprises silicon. A disadvantage of using silicon is that it has a high thermal expansion coefficient which can cause unwanted stress to the die 4. A further disadvantage of using silicon is that it reduces the molded epoxy's 16 ability to seal to the heat sink 6. Silicon also has a low power cycle life.

Figure 2:
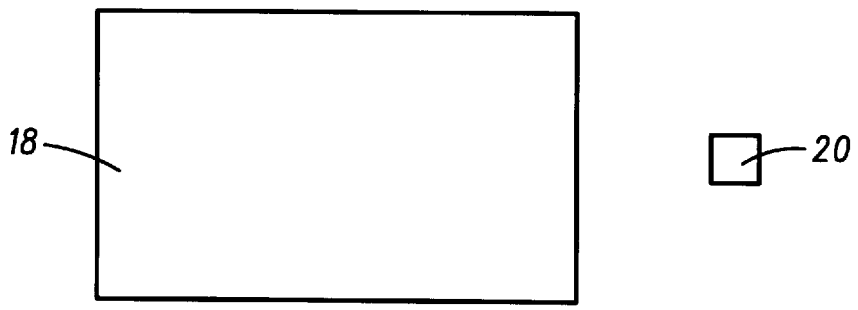
FIG. 2 is a schematic diagram showing the foot print of the device of FIG. 1.

FIG. 2 shows the foot print of the known device 2; that is, the cross-sectional surface areas 18 and 20 of the first 8 and second 14 contacts respectively, which surface areas 18, 20 will be soldered to, for example, a circuit board (not shown) when the device 2 is mounted on the circuit board.

As can be seen from FIG. 2, such a device 2 has first 8 and second 14 contacts having large surface areas. Such large contact surface areas makes soldering of the device 2 difficult. Device 2 also has a large heat sink 6 which is designed to remove energy from the die 4 but which, when the device 2 is mounted on a circuit board, is located on the circuit board. This results in heat transfer to the circuit board solder junction resulting in potential circuit board solder failures. Also, having such a large heat sink 6 increases the weight of the device 2 which is a disadvantage when pick-and-place equipment are used to mount the devices 2 on circuit boards.

Figure 3:
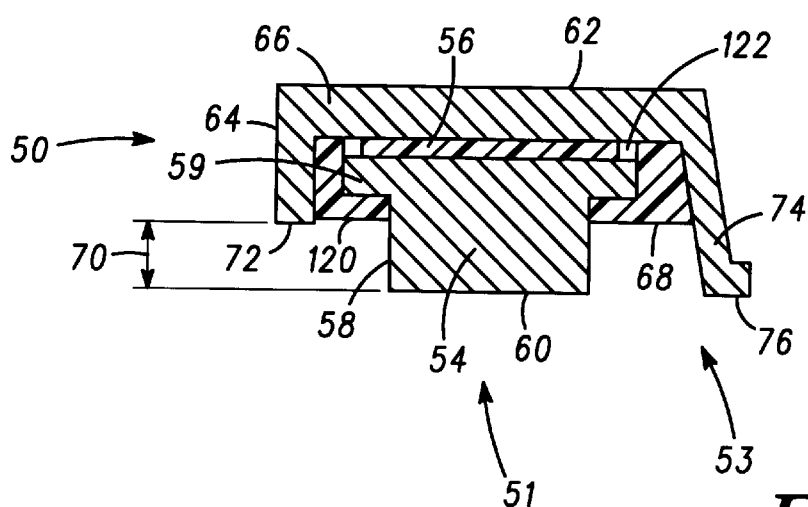
FIG. 3 is a cross-sectional schematic diagram of a surface mount semiconductor diode device in accordance with the present invention.

Referring now to FIG. 3, a surface mount semiconductor diode device 50 in accordance with a preferred embodiment of the present invention having first 51 and second 53 coplanar contacts comprises a semiconductor element or die 52 having a first surface electrically mounted on a surface 56 of a first member 54 formed of conductive material. The first member 54 has an arm 58 which extends in a direction away from the surface 56 of the first member 54. The end 60 of the arm 58 away from the surface 56 forms the first contact 51 of the device 50.

The surface mount semiconductor diode device 50 further comprises a cup member 62 formed of a conductive material. The cup member 62 comprises a wall 64 extending from a bottom portion 66 so as to form an opening 68 surrounded by the wall 64. The semiconductor element 52 and first member 54 are mounted within the opening 68 such that a second surface of the semiconductor element 52 is electrically coupled to the bottom portion 66 of the cup member 62 and the end 60 of the arm extends a predetermined distance 70 above a top surface 72 of the wall 64.

The cup member 62 further comprises a leg portion 74 integral with and extending from the top surface 72 of the wall 64 such that an end 76 of the leg portion 74 is coplanar with the end 60 of the arm 58 and forms the second contact 53. The leg portion 74 is formed as an integral part of the cup member 62 and thus no additional steps are required to form the second contact 53, such as an additional step of soldering a tab to a heat sink.

Figure 5:
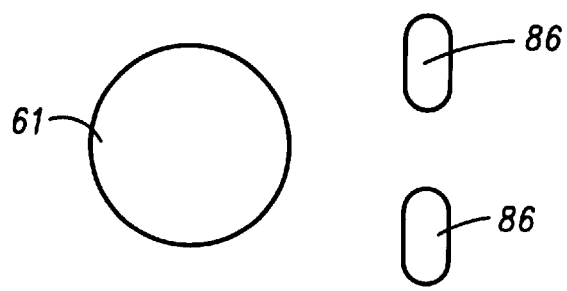
FIG. 5 is a schematic diagram showing the foot print of the device of FIG. 3.

Preferably, the first member 54 is pin-shaped. The arm 58 forms the shank of the pin-shaped first member 54 and has a circular cross-sectional area in a direction perpendicular to the shank axis. The end 60 of the arm therefore has a circular surface area 61, as can be seen in FIG. 5, which shows the footprint of the surface mount semiconductor diode device 50. The pin-shaped first member 54 further has a head portion 59 from which the arm 58 extends. The head portion 59 has a larger cross-sectional area than the arm 58 to support the semiconductor element 52. The semiconductor element 52 is soldered to the surface 56 of the head portion 59.

Since the cross-sectional area of the arm 58 is less than the head portion 59, the surface area 61 of the first contact 51 can be reduced compared to the case when the cross-sectional area of the arm 58 and head portion 59 are the same size.

Figure 4:
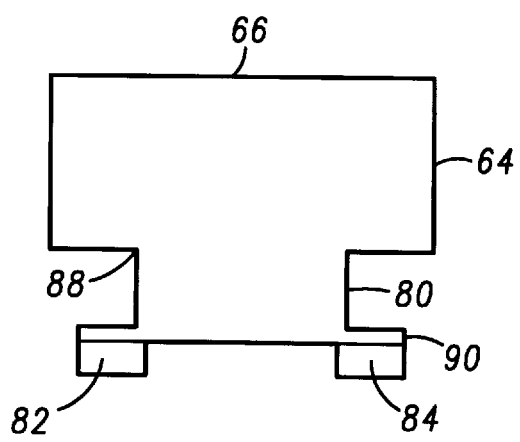
FIG. 4 is a side view schematic diagram of the device of FIG. 3.

Referring now to FIG. 4 which shows the preferred leg portion 74 of the cup member 62 in more detail.

In the preferred embodiment, the leg portion 74 comprises a main portion 80 extending from the top surface of the wall and two feet portions 82 and 84 extending from the main portion 80 at the end of the leg portion 74. The two feet portions 82 and 84 form the second contact 53. Each feet portion 82 and 84 has a rectangular cross-sectional area in a plane in which the first 51 and second 53 contacts are coplanar. Thus, the second contact 53 has a surface area comprising the two rectangular cross-sectional areas 86 of the feet portions 82 and 84, as can be seen in FIG. 5, which shows the footprint of the surface mount semiconductor diode device 50. It will be appreciated that having two feet portions 82 and 84 reduces the surface area of the second contact 53.

FIG. 5 shows the cross-sectional surface areas 61 and 86 of the first 51 and second 86 contacts respectively, which surface areas 61, 86 will be soldered to, for example, a circuit board (not shown) when the device 50 is mounted on the circuit board. As can be seen by comparing the known device's 2 footprint shown in FIG. 2 with FIG. 5, the first 51 and second 53 contacts in accordance with the present invention have smaller surface areas. This means that the device 50 in accordance with the present invention is easier to solder and once soldered will be more stable.

Preferably, the main portion 80 of the leg portion 74 is T-shaped. A narrow end 88 of the T-shaped main portion 80 is connected to the wall 64 of the cup member 62 and the two feet portions 82, 84 extend from a broad end 90 of the T-shaped main portion 80. The main portion 80 may alternatively be rectangular shaped. However, being T-shaped makes the main portion 80 easier to bend during manufacture of the device 50 and thus reduces the risk of breaking-off the leg portion 74.

Figure 6:
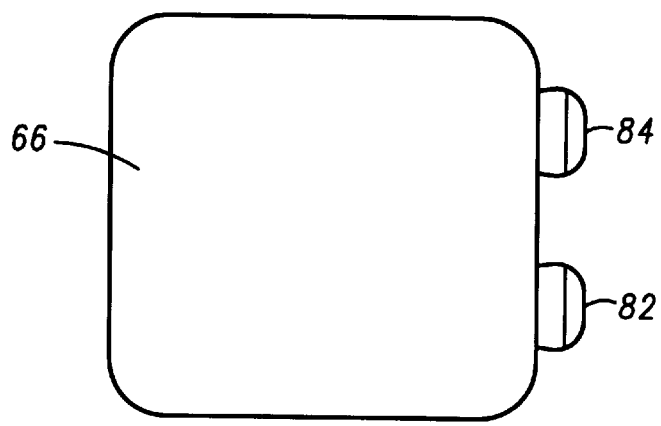
FIG. 6 is a top view schematic diagram of the device of FIG. 3.

In order to make the device easier to pick-up, for gay pick-and-place equipment, the bottom portion 66 of the cup member 62 preferably has a substantially rectangular cross-sectional area, as shown in FIG. 6.

In the preferred embodiment, the first member 54 and cup member 62 are formed from a copper material.

Figure 7:
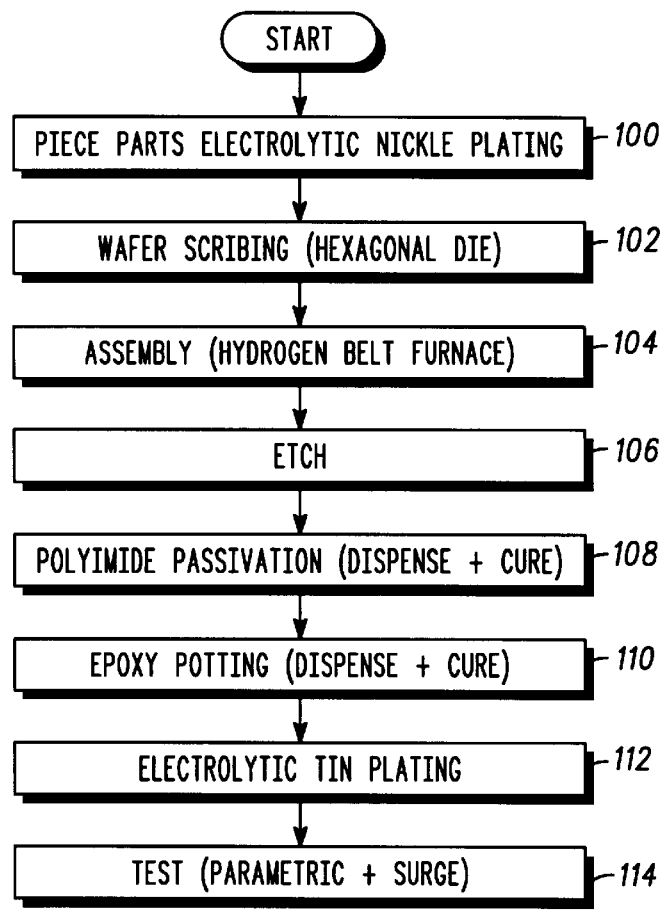
FIG. 7 is a flow chart showing different steps of a method for forming a surface mount semiconductor diode device in accordance with the present invention.

A method for forming a surface mount semiconductor diode device in accordance with a preferred embodiment of the present invention will now be described with reference to FIG. 7 which is a flow chart showing the different steps in the method.

Figure 8:
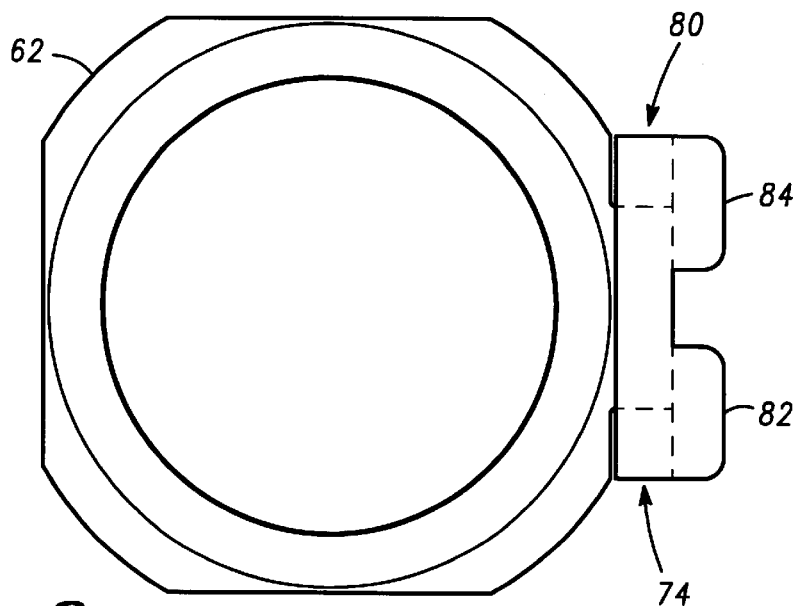
FIG. 8 is a top view schematic diagram showing the cup member of the surface mount semiconductor diode device in accordance with the present invention after a step shown in FIG. 7.

Predetermined shapes for the cup member 62 and first member 54 are stamped out from a sheet of conductive material, such as copper and are plated with nickel, block 100. The predetermined shapes are deformed into the cup member 62 (see FIG. 8) and first member 54 by bending the appropriate parts. At block 102, wafers are scribed to form hexagonal die. At block 104, the surface mount semiconductor diode device is assembled. A first surface of the die is mounted on the surface 56 of the first member 54 and a second opposing surface of the die is mounted in contact with the bottom portion 66 of the cup member 62. The assembly is then processed through a furnace so that solder between the first surface of the die and the surface 56 of the first member 54 and between the second surface of the die and the bottom portion 66 reflows and forms a bond therebetween.

The sides of the die are then etched so as to clean the exposed surfaces of the die, block 106. At block 108, polyimide is deposited around the die and then the device is potted with liquid epoxy, block 110. The liquid epoxy 120 surrounds the die and first member 54 and fills the opening 68 substantially up to the top surface 72 of the wall 64 (see FIG. 3). The polyimide 122 (see FIG. 3) is a passivation layer preventing the liquid epoxy from coming into contact with the die. The first 51 and second 53 contacts are then plated with tin (block 112) so as to make the contacts easier to solder and then electrical tests are carried out on the surface mount semiconductor diode device.

In view of the arrangement of the present invention, particularly the cup member 62, the present invention can use liquid epoxy which does not require a high pressure process step as with molded epoxy. The surface mount semiconductor diode device in accordance with the present invention is therefore subject to less molding stress compared to the prior art arrangements which use molded epoxy. This makes the surface mount semiconductor diode device in accordance with the present invention more reliable.

In the prior art arrangements which use molded epoxy, in order to avoid short circuits at the open junction at the side of the die, silicon is used as a passivation layer so as to prevent the molded epoxy from being in contact with the open junction of the die. Silicon has a high thermal expansion coefficient and thus can cause stress problems to the die. The preferred embodiment of the present invention avoids this problem by using a polyimide passivation layer around the die. Polyimide has a lower thermal expansion coefficient compared to silicon and therefore causes less stress.

A further advantage of the surface mount semiconductor diode device 50 in accordance with the present invention is that heat is conducted away from the semiconductor element 52 in two directions: from the bottom portion 66 of the cup member and from the arm 58 of the first member 54. This ensures that not all the heat is transferred to the circuit board on which the device is mounted and so reduces the risk of circuit board solder failures.

In summary, the present invention provides a surface mount semiconductor diode device having two coplanar contacts which is simple to manufacture and which does not require additional steps to attach tabs for one of the contacts.

In addition, the surface mount semiconductor diode device in accordance with the preferred embodiment has smaller contact surface areas than the known devices and is therefore easier to solder to a circuit board.

What is claimed is:

1. A surface mount semiconductor diode device having first and second coplanar contacts, the device comprising:
    a semiconductor element having a first surface electrically mounted on a surface of a first member formed of conductive material, the first member having an arm which extends in a direction away from the surface of the first member, an end of the arm forming the first contact; and
    a cup member formed of conductive material and comprising a wall extending from a bottom portion so as to form an opening surrounded by the wall and having the bottom portion as a base,
        wherein the semiconductor element and first member are mounted within the opening such that a second surface of the semiconductor element is electrically coupled to the bottom portion of the cup member and the end of the arm extends above a top surface of the wall,
        wherein the cup member further comprises a leg portion integral with and extending from the top surface of the wall such that an end of the leg portion is coplanar with the end of the arm, the end of the leg portion forming the second contact.

2. A surface mount semiconductor diode device according to claim 1 wherein the leg portion comprises a main portion extending from the top surface of the wall and two feet portions extending from the main portion at the end of the leg portion, the two feet portions providing the second contact.

3. A surface mount semiconductor diode device having first and second coplanar contacts, the device comprising:
    a semiconductor element having a first surface electrically mounted on a surface of a first member formed of conductive material, the first member having an arm which extends in a direction away from the surface of the first member, an end of the arm forming the first contact; and
    a cup member formed of conductive material and comprising a wall extending from a bottom portion so as to form an opening surrounded by the wall and having the bottom portion as a base,
        wherein the semiconductor element and first member are mounted within the opening such that a second surface of the semiconductor element is electrically coupled to the bottom portion of the cup member and the end of the arm extends above a top surface of the wall,
        wherein the cup member further comprises a lea portion integral with and extending from the top surface of the wall such that an end of the leg portion is coplanar with the end of the arm, the end of the leg portion forming the second contact, and wherein the main portion of the leg portion comprises a T-shaped member, a narrow end of the T-shaped member being connected to the wall and the two feet portions extending from a broad end of the T-shaped member.

4. A surface mount semiconductor diode device according to claim 3 wherein each feet portion has a rectangular cross-sectional area in a plane in which the first and second contacts are coplanar, wherein the second contact has a surface area comprising the two rectangular cross-sectional areas of the feet portions.

5. A surface mount semiconductor diode device according to claim 1 wherein the end of the arm has a circular cross-sectional area, such that the first contact has a circular surface area.

6. A surface mount semiconductor diode device according to claim 5 wherein the first member is pin-shaped, the arm forming a shank of the pin-shaped first member and the first member further comprising a head portion from which the arm extends, the head portion having a larger cross-sectional area than the arm.

7. A surface mount semiconductor diode device according to claim 1 wherein liquid epoxy surrounds the semiconductor element and first member and fills the opening.

8. A surface mount semiconductor diode device according to claim 7 wherein a polyimide layer surrounds the semiconductor element so that the semiconductor element is not in contact with the liquid epoxy.

9. A surface mount semiconductor diode device according to claim 1 wherein the bottom portion of the cup member has a substantially rectangular cross-sectional area in a plane parallel to the plane in which the first and second contacts are coplanar.

\* \* \* \* \*